United States Patent
Chan

(10) Patent No.: US 12,115,496 B2
(45) Date of Patent: Oct. 15, 2024

(54) APPARATUS FOR TREATMENT GASEOUS POLLUTANTS

(71) Applicant: BHT SERVICES PTE. LTD., Singapore (SG)

(72) Inventor: Chee Wei Chan, Kallang (SG)

(73) Assignee: BHT SERVICES PTE. LTD., Singapore (SG)

( * ) Notice: Subject to any disclaimer, the term of this patent is extended or adjusted under 35 U.S.C. 154(b) by 574 days.

(21) Appl. No.: 17/522,613

(22) Filed: Nov. 9, 2021

(65) Prior Publication Data

US 2022/0134281 A1    May 5, 2022

Related U.S. Application Data

(63) Continuation of application No. PCT/SG2020/050669, filed on Nov. 18, 2020.

(60) Provisional application No. 62/938,658, filed on Nov. 21, 2019.

(51) Int. Cl.
*B01D 53/76* (2006.01)
*C23C 16/44* (2006.01)
*F23G 7/08* (2006.01)
*F23M 5/08* (2006.01)

(52) U.S. Cl.
CPC .......... *B01D 53/76* (2013.01); *C23C 16/4412* (2013.01); *F23G 7/08* (2013.01); *F23M 5/08* (2013.01)

(58) Field of Classification Search
None
See application file for complete search history.

(56) References Cited

U.S. PATENT DOCUMENTS

| | | | |
|---|---|---|---|
| 2003/0054299 A1 | 3/2003 | Kawamura et al. | |
| 2008/0131334 A1* | 6/2008 | Kawamura | F23G 5/24 422/169 |
| 2012/0115098 A1 | 5/2012 | Feng | |
| 2018/0335210 A1 | 11/2018 | Knight | |
| 2020/0139300 A1* | 5/2020 | Chan | F01N 3/26 |

FOREIGN PATENT DOCUMENTS

KR    101791478 B1    10/2017

* cited by examiner

*Primary Examiner* — Jelitza M Perez
(74) *Attorney, Agent, or Firm* — MUNCY, GEISSLER, OLDS & LOWE. P.C.

(57) ABSTRACT

An apparatus for treatment of gaseous pollutants, the apparatus comprising a reaction portion and a passage. The reaction portion comprises a gas inlet unit, a reaction unit, a combustion unit and a cooling unit. The passage comprises a transverse section, a connection section and a straight section, the transverse section is provided with a top gas inlet in communication with the reaction portion and a lateral gas inlet, the connection section is connected between the transverse section and the straight section, the top gas inlet receives an effluent passing through the reaction portion and then flowing downwards, the lateral gas inlet receives a transverse air flow, and the effluent is driven by the transverse gas flow to form a cyclone and is discharged from an outlet of the straight section by means of the connection section.

14 Claims, 13 Drawing Sheets

APPARATUS FOR TREATMENT GASEOUS POLLUTANTS

CROSS-REFERENCE TO RELATED APPLICATION

This application is a national stage application, filed under 35 U.S.C. § 371, of International Patent Application No. PCT/SG2020/050669, filed on Nov. 18, 2020, which is incorporated by reference herein in its entirety.

The application claims priority to U.S. Provisional Application No. 62/938,658, filed on Nov. 21, 2019, the entire contents of which are incorporated herein by reference.

FIELD OF THE INVENTION

The invention relates to an apparatus for treatment of gaseous pollutants, and more particularly to an apparatus for treatment of an effluent stream from a semiconductor manufacturing process.

BACKGROUND OF THE INVENTION

Waste gas in the semiconductor manufacturing process contains a variety of chemical substances harmful to the human body or the environment. Various ways to treat waste gas in the semiconductor manufacturing process comprise combustion type, plasma type, wet type and catalyst type abatement apparatuses.

For pollutants such as silane, arsine and phosphine produced during the chemical vapor deposition (CVD) process, thermal combustion-type waste gas treatment apparatuses are often used. Traditional commercial products include the LARCH model machines from DAS or the Spectra series machines from Edwards.

SUMMARY OF THE INVENTION

The invention provides an apparatus for treatment of gaseous pollutants comprises a reaction portion comprising: a gas inlet unit comprises a first outer wall, a first inner wall, a first cooling chamber, a gas inlet chamber, and at least one guide conduit, the first cooling chamber is being defined between the first outer wall and the first inner wall, the first inner wall defines the gas inlet chamber, the at least one guide conduit is mounted on a side of the gas inlet chamber and introduces an effluent stream from a semiconductor manufacturing process to the gas inlet chamber; a reaction unit coupled below the gas inlet unit, the reaction unit comprises a second outer wall, a second inner wall, a second cooling chamber and a reaction chamber, the second cooling chamber is being defined between the second outer wall and the second inner wall, the second inner wall defines the reaction chamber, the reaction chamber and the gas inlet chamber communicate with each other to receive the effluent stream from the gas inlet chamber; a combustion unit comprises at least one combustion assembly which comprises a pre-mixing section, an ignition plug, a first duct and a second duct, the first duct and the second duct are configured to introduce an oxidant and a fuel gas to the pre-mixing section, respectively, the ignition plug is mounted adjacent to an opening end of the pre-mixing section, the opening end is connected to the reaction chamber, the ignition plug is configured to generate a spark for igniting the oxidant and the fuel gas and to provide a pilot flame to the reaction chamber through the opening end to burn the effluent stream; and a cooling unit comprises a first pipe and a second pipe, the first pipe is connected between a cooling source and the second cooling chamber, the second pipe is connected between the second cooling chamber and the first cooling chamber, wherein the first cooling chamber and the second cooling chamber communicate with each other via the second pipe; a passage connected to the reaction portion and comprises a transverse section, a connecting section and a vertical section, the transverse section is substantially parallel to an extension of an installation plane of the apparatus for treating of gaseous pollutants, the vertical section is substantially perpendicular to the installation plane, the transverse section comprises a lateral gas inlet and a top gas inlet communicating with the reaction chamber of the reaction portion, the connecting section is connected between the transverse section and the vertical section; wherein the top gas inlet receives the effluent stream flowing downward through the reaction portion, the lateral gas inlet receives a transverse gas flow, and the effluent stream is driven by the transverse gas flow to form a cyclone that is discharged through the connecting section and from an outlet of the vertical section opposite to the connecting section.

The invention further provides an apparatus for treatment of gaseous pollutants comprises a reaction portion comprising: a gas inlet unit comprises a gas inlet chamber, and at least one guide conduit, the at least one guide conduit is mounted on a side of the gas inlet chamber and introduces an effluent stream from a semiconductor manufacturing process to the gas inlet chamber; a reaction unit coupled below the gas inlet unit, the reaction unit comprises a reaction chamber, the reaction chamber and the gas inlet chamber communicate with each other to receive the effluent stream from the gas inlet chamber, wherein the reaction unit has a first height prolonging a flowing time of the effluent stream in the reaction chamber; a combustion unit comprises at least one combustion assembly, the combustion assembly comprises a pre-mixing section, an ignition plug, a first duct and a second duct, the first duct and the second duct are configured to introducing an oxidant and a fuel gas to the pre-mixing section, respectively, the ignition plug is mounted adjacent to an opening end of the pre-mixing section, the opening end is connected to the reaction chamber, the ignition plug is configured to generate a spark for igniting the oxidant and the fuel gas and to provide a pilot flame to the reaction chamber through the opening end to burn the effluent stream; and a passage connected to the reaction portion and comprises a transverse section, a connecting section and a vertical section, the transverse section is substantially parallel to an installation plane of the apparatus for treatment of gaseous pollutants, the vertical section is substantially perpendicular to the installation plane, the transverse section comprises a lateral gas inlet and a top gas inlet communicating with the reaction chamber of the reaction portion, the connecting section is connected between the transverse section and the vertical section; wherein the top gas inlet receives the effluent stream flowing downward through the combustion unit, the lateral gas inlet receives a transverse gas flow, and the effluent stream is driven by the transverse gas flow to form a cyclone that is discharged through the connecting section and from an outlet of the vertical section opposite to the connecting section; wherein the vertical section has a second height for prolonging a flowing time of the effluent stream in the vertical section, so that a temperature of the effluent stream is dropped below 200° C. as the effluent stream flows from the reaction chamber to the outlet of the vertical section.

DETAILED DESCRIPTION OF THE PREFERRED EMBODIMENTS

The following embodiments are applied to treat an effluent stream from a semiconductor manufacturing process, such as waste gas. Although the term water is used in many places in the following embodiments, it is only for the convenience of description, and the invention is not limited to water, other alternative media can be used.

Herein, the terms used in the description of various embodiments are only for the purpose of describing specific examples, and are not intended to be limitative. Unless the context clearly indicates, or deliberately limits the quantity of elements, otherwise the singular forms "a", "an" and "the" used herein also include plural forms. On the other hand, the terms "including" and "comprising" are intended to be included, meaning that there may be additional elements other than the listed elements; when one element is expressed as connected or coupled to another element, the element can be connected or coupled to the other element directly or through an intermediate element; when an element describing a layer, a region, or a baseplate is referred to as mounted on another element, it means that the element can be directly mounted on the other element, or there may be an intermediate element between each other, relatively speaking, when one element is referred to as directly mounted on another element, an intermediate element does not exist between each other; in addition, the order in the description of the embodiments should not be interpreted as implying that the operations or steps must rely on the literal order, alternative embodiments may use an order different from the order described herein to carry out the steps, operations, methods, etc.

Figure 1:
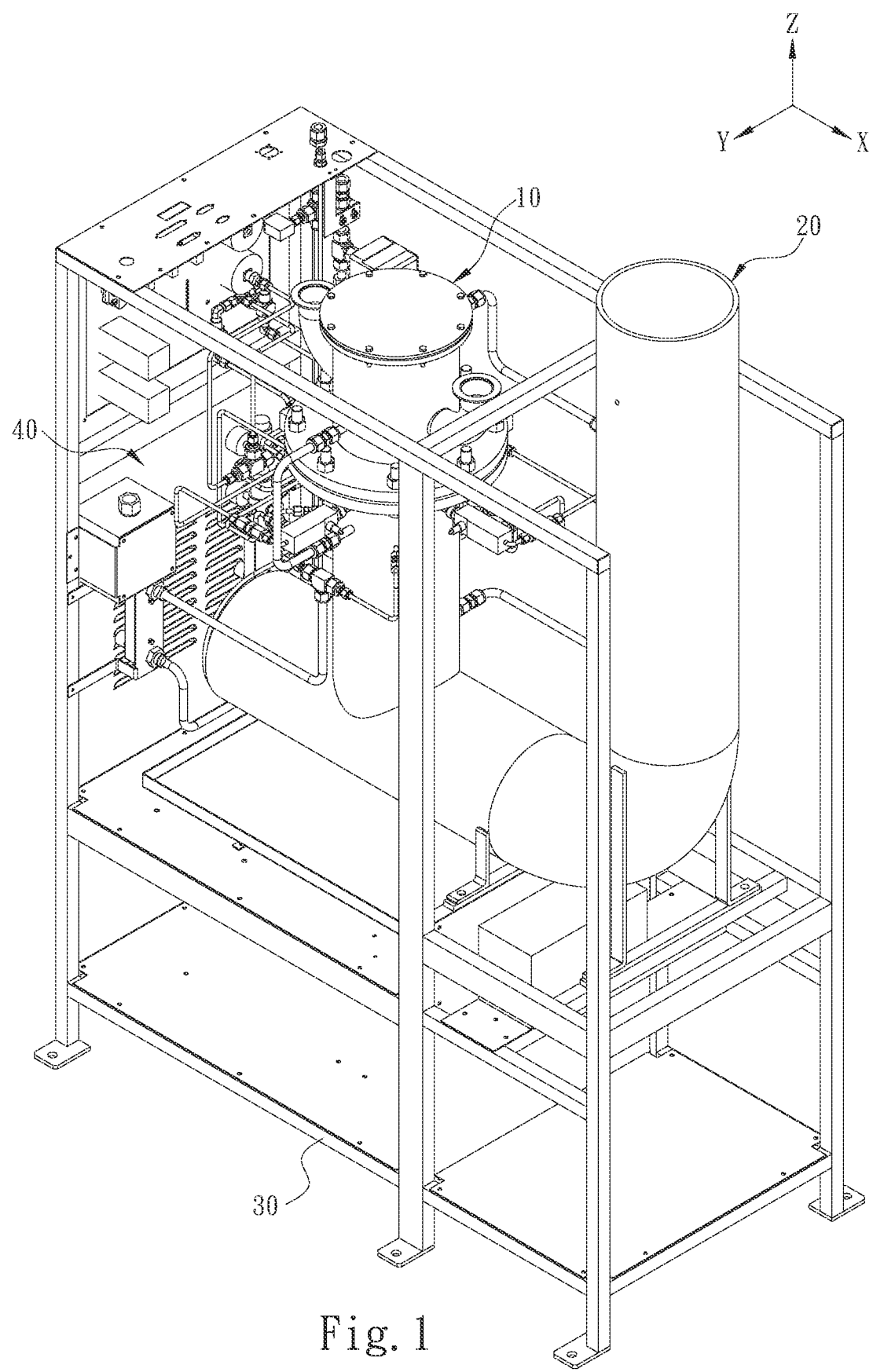
FIG. 1 is a perspective assembly view of an embodiment of the invention.
Figure 2A:
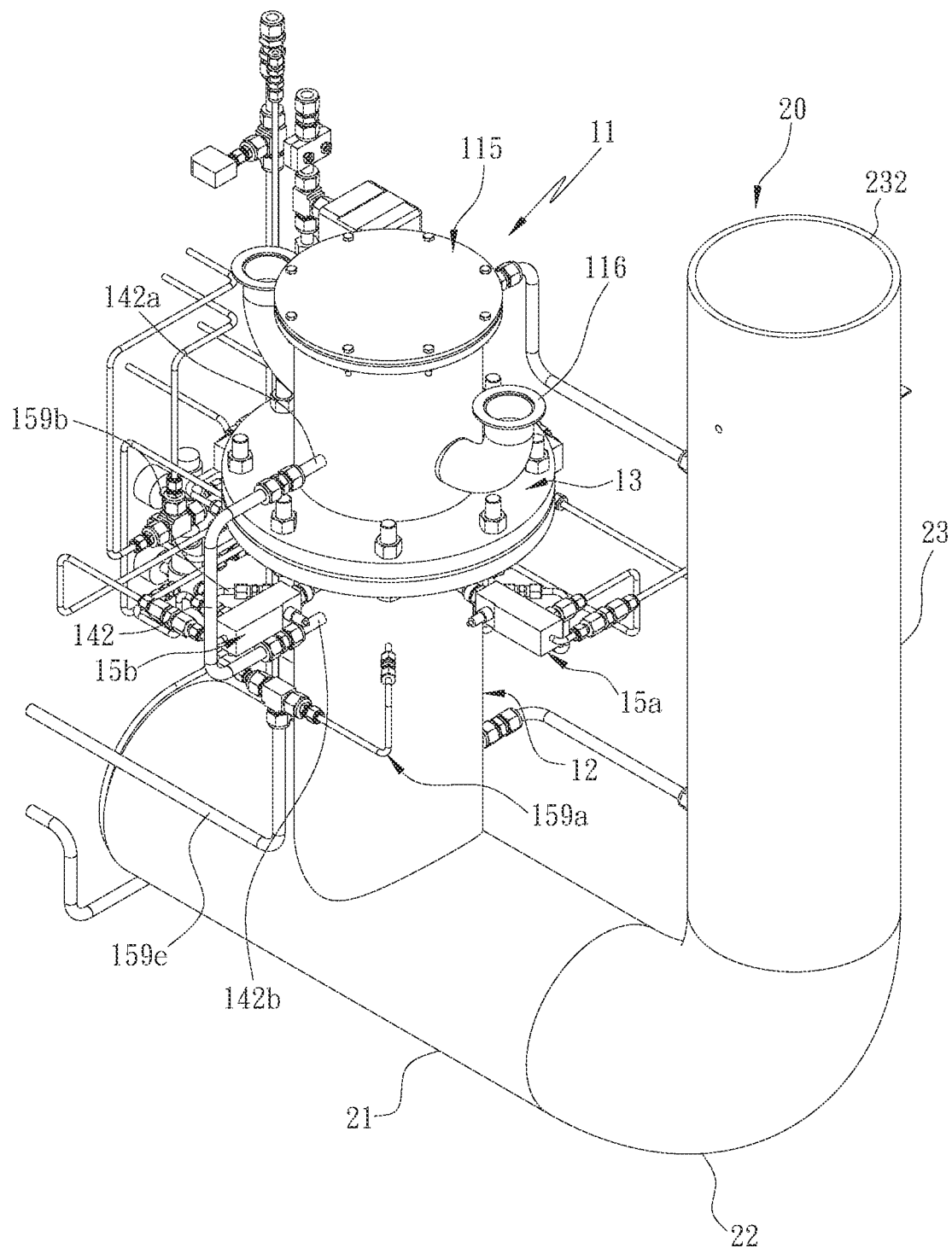
FIG. 2A is a perspective assembly view of an embodiment of the invention.
Figure 2B:
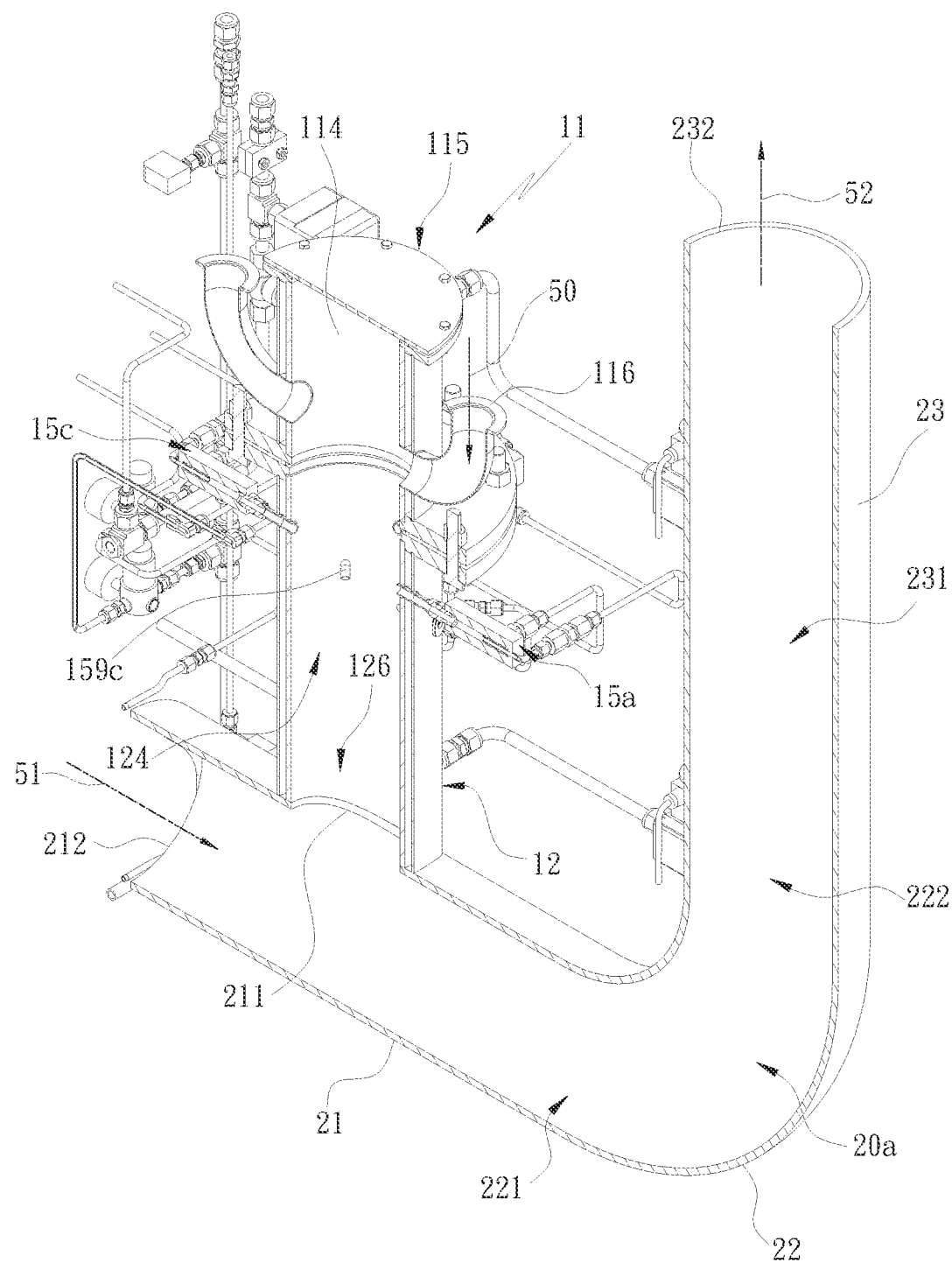
FIG. 2B is a perspective cross-section view of FIG. 2A along the XZ plane.
Figure 2C:
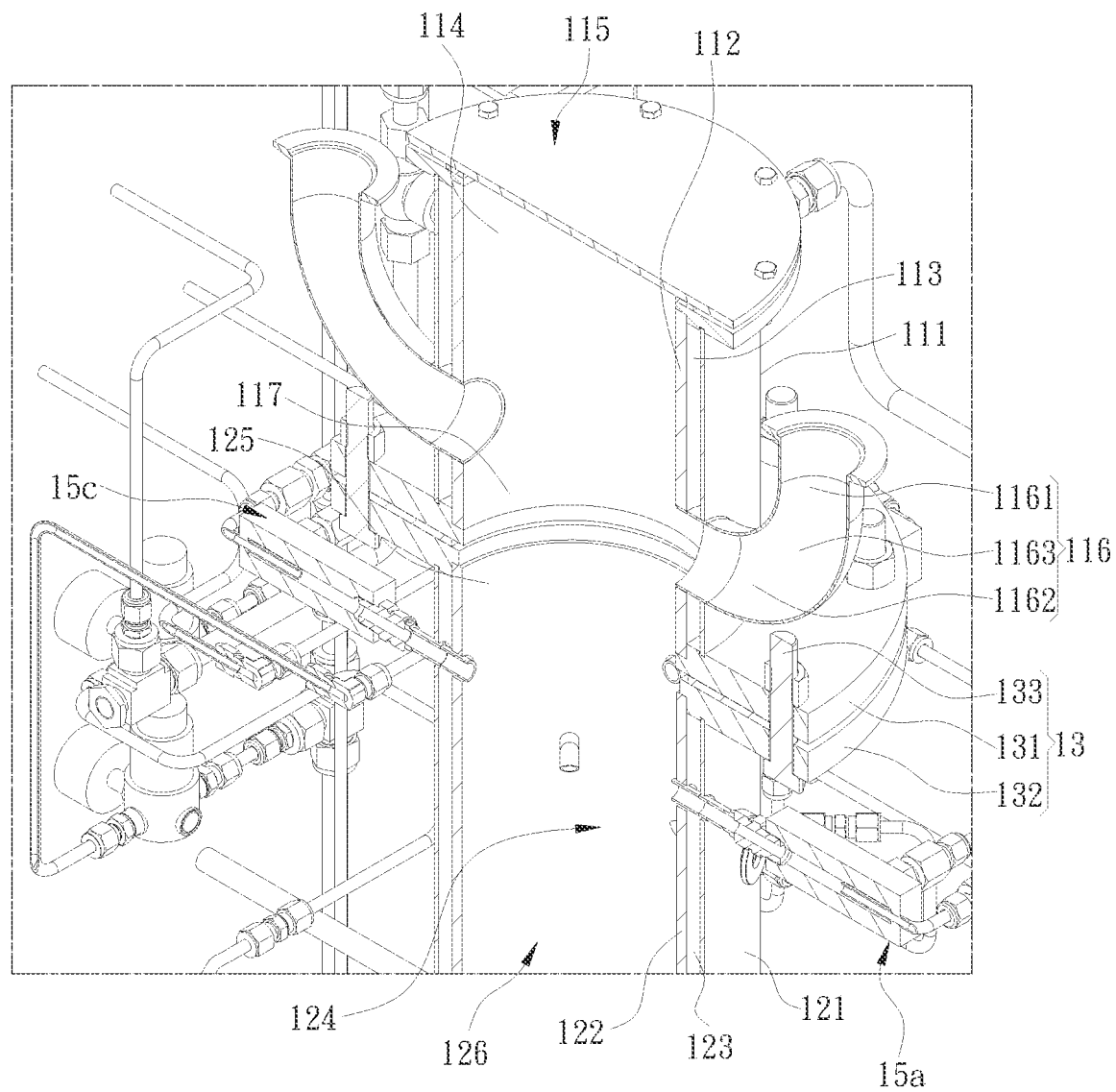
FIG. 2C is a partial enlarged view of FIG. 2B.
Figure 3:
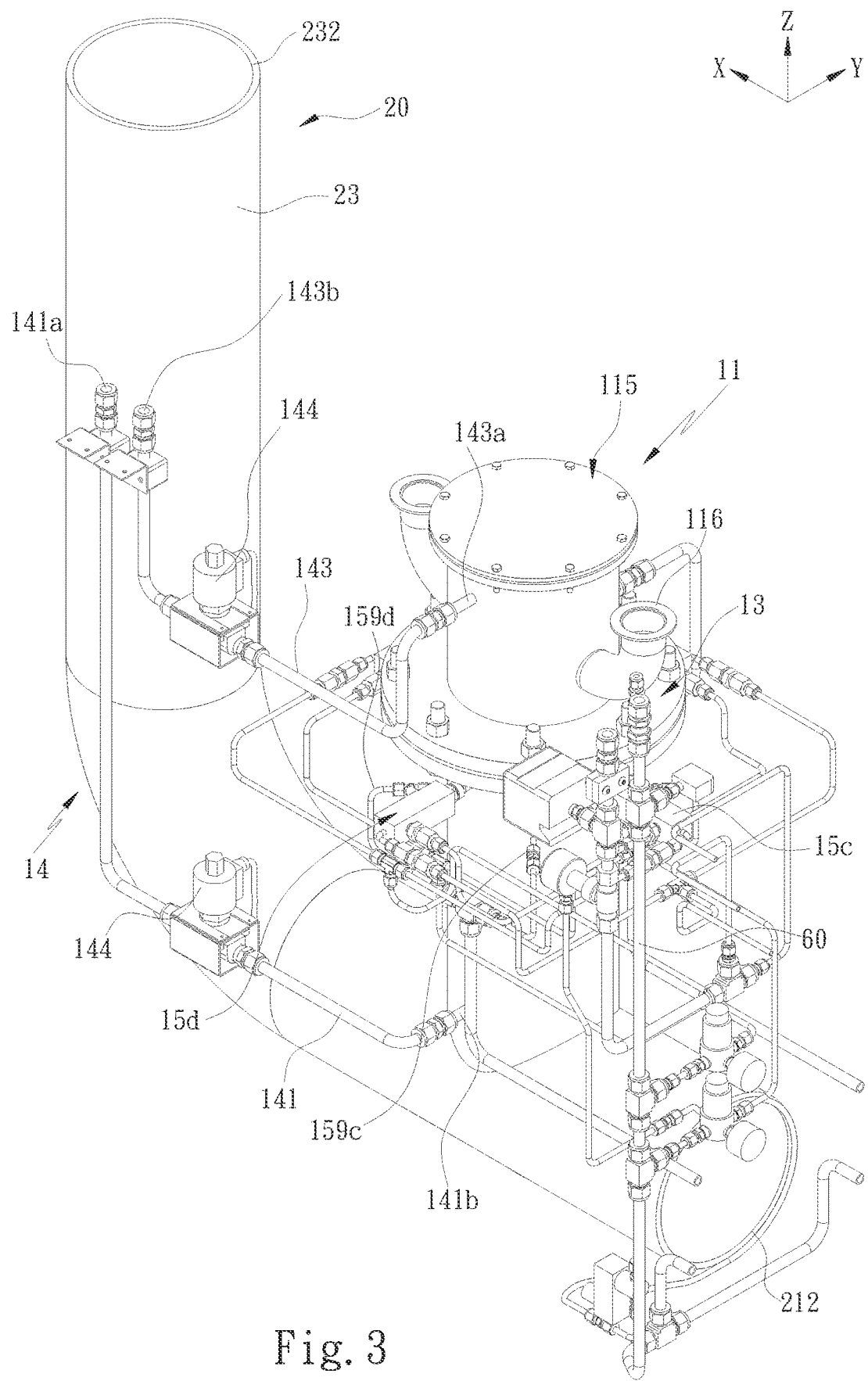
FIG. 3 is a perspective assembly view of an embodiment of the invention viewed from another viewing angle.

One aspect of the invention relates to a combustion-type (also called thermal oxidation type) apparatus for treatment of gaseous pollutants in a semiconductor manufacturing process. The apparatus is not a wet abatement system (i.e., dry type). Referring to FIG. 1, FIG. 2A, FIG. 2B, FIG. 2C, and FIG. 3, FIG. 1 is a perspective assembly view of an embodiment of the invention, FIG. 2A, FIG. 2B, and FIG. 2C are schematic diagrams of FIG. 1 with some components omitted, and FIG. 3 is a perspective assembly view of FIG. 2A from another viewing angle. In this embodiment, the waste gas treatment apparatus comprises a reaction portion 10, an exhaust portion 20, a frame 30, and a control portion 40. The reaction portion 10 comprises a gas inlet unit 11, a reaction unit 12, a connecting unit 13, a cooling unit 14, and a combustion unit (described in detail below). As shown in FIG. 2A and FIG. 2B, the gas inlet unit 11 is mounted above the reaction unit 12, and the gas inlet unit 11 is coupled to the reaction unit 12 through the connecting unit 13.

The gas inlet unit 11 comprises a first outer wall 111, a first inner wall 112, a first cooling chamber 113, a gas inlet chamber 114, an upper cover 115, at least one guide conduit 116 and a bottom opening 117. The first cooling chamber 113 is mounted between the first outer wall 111 and the first inner wall 112. The first cooling chamber 113 is a first annular chamber that spacedly surrounds the gas inlet chamber 114. The first inner wall 112 defines the gas inlet chamber 114. The upper cover 115 seals a top of the gas inlet chamber 114. The at least one guide conduit 116 is mounted on a side of the gas inlet chamber 114 and penetrates through the first outer wall 111, the first inner wall 112 and the first cooling chamber 113 to communicate with the gas inlet chamber 114. The at least one guide conduit 116 is configured to introduce an effluent stream 50 into the gas inlet chamber 114. The gas inlet chamber 114 extends along a vertical Z axis, and an insertion direction of the at least one guide conduit 116 in the gas inlet chamber 114 is not parallel to the Z axis. In this embodiment, the insertion direction intersects the Z axis at an angle, and the angle is preferably between 45° and 90°. In this embodiment, the at least one guide conduit 116 comprises a first section 1161, a second section 1162, and a curved section 1163. The curved section 1163 is mounted between the first section 1161 and the second section 1162. The curved section 1163 is configured to buffer a speed of the effluent stream 50 from the first section 1161 to the second section 1162 through the curved section 1163 and from the second section 1162 into the gas inlet chamber 114. In the invention, the Z axis is substantially orthogonal to an installation plane (that is, the XY plane) of the apparatus. In other words, the Z axis and a normal vector of the installation plane overlap or intersect by a small angle.

The reaction unit 12 comprises a second outer wall 121, a second inner wall 122, a second cooling chamber 123, a reaction chamber 124, an upper opening 125, and a lower opening 126. The second cooling chamber 123 is defined between the second outer wall 121 and the second inner wall 122, the second cooling chamber 123 is a second annular chamber, the second annular chamber is spaced with the reaction chamber 124, the second inner wall 122 defines the reaction chamber 124, the upper opening 125 and the lower opening 126 are mounted at two ends of the reaction chamber 124, respectively, and the upper opening 125 communicates with the bottom opening 117 of the gas inlet unit 11.

The connecting unit 13 is connected between the gas inlet unit 11 and the reaction unit 12. The connecting unit 13 comprises an upper half 131, a lower half 132, and a plurality of fixing members 133. The upper half 131 is connected to the gas inlet unit 11, the lower half 132 is connected to the reaction unit 12, and the upper half 131 and the lower half 132 are assembled together by a plurality of the fixing members 133.

Figure 4:
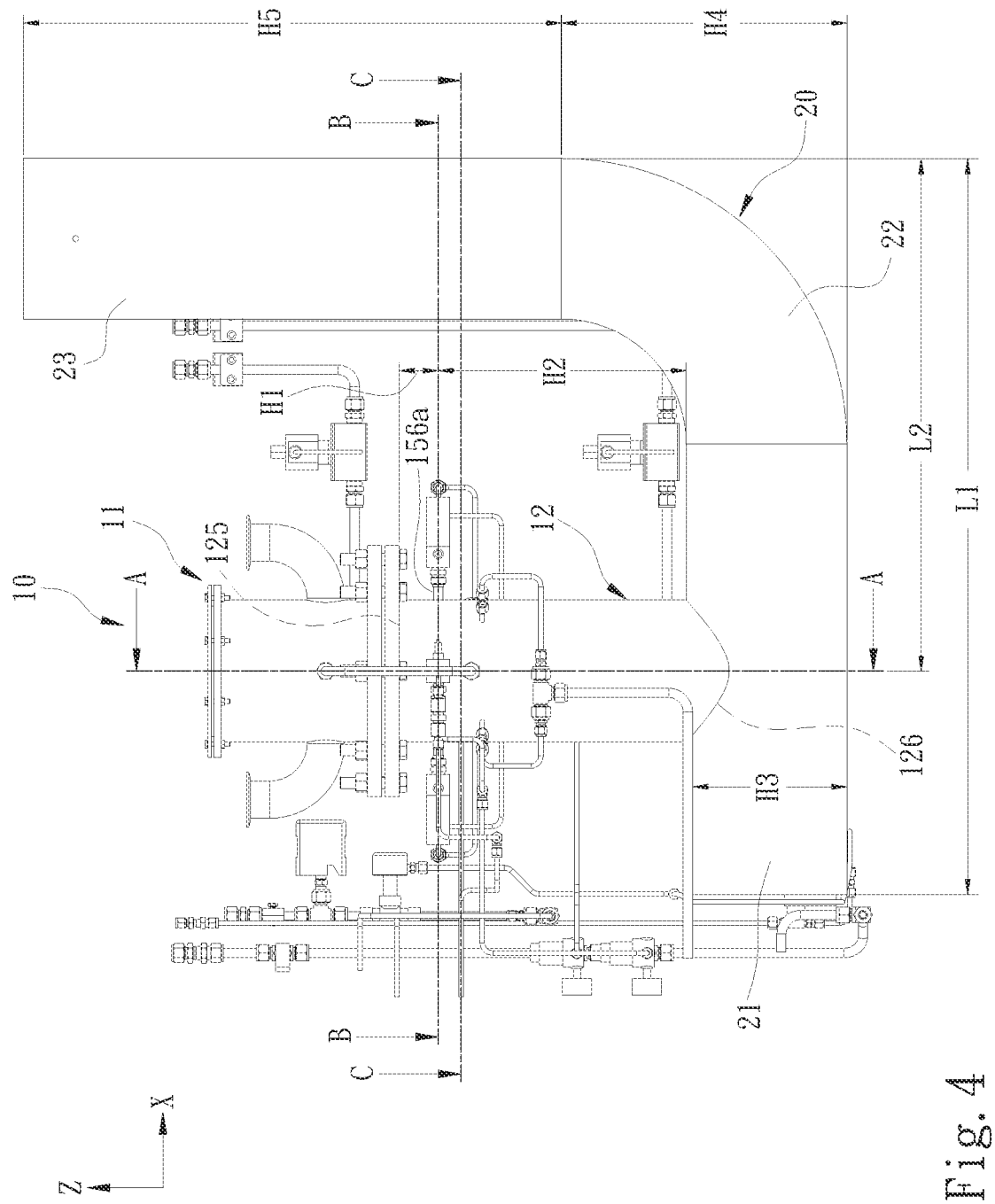
FIG. 4 is a side view of an embodiment of the invention.
Figure 5:
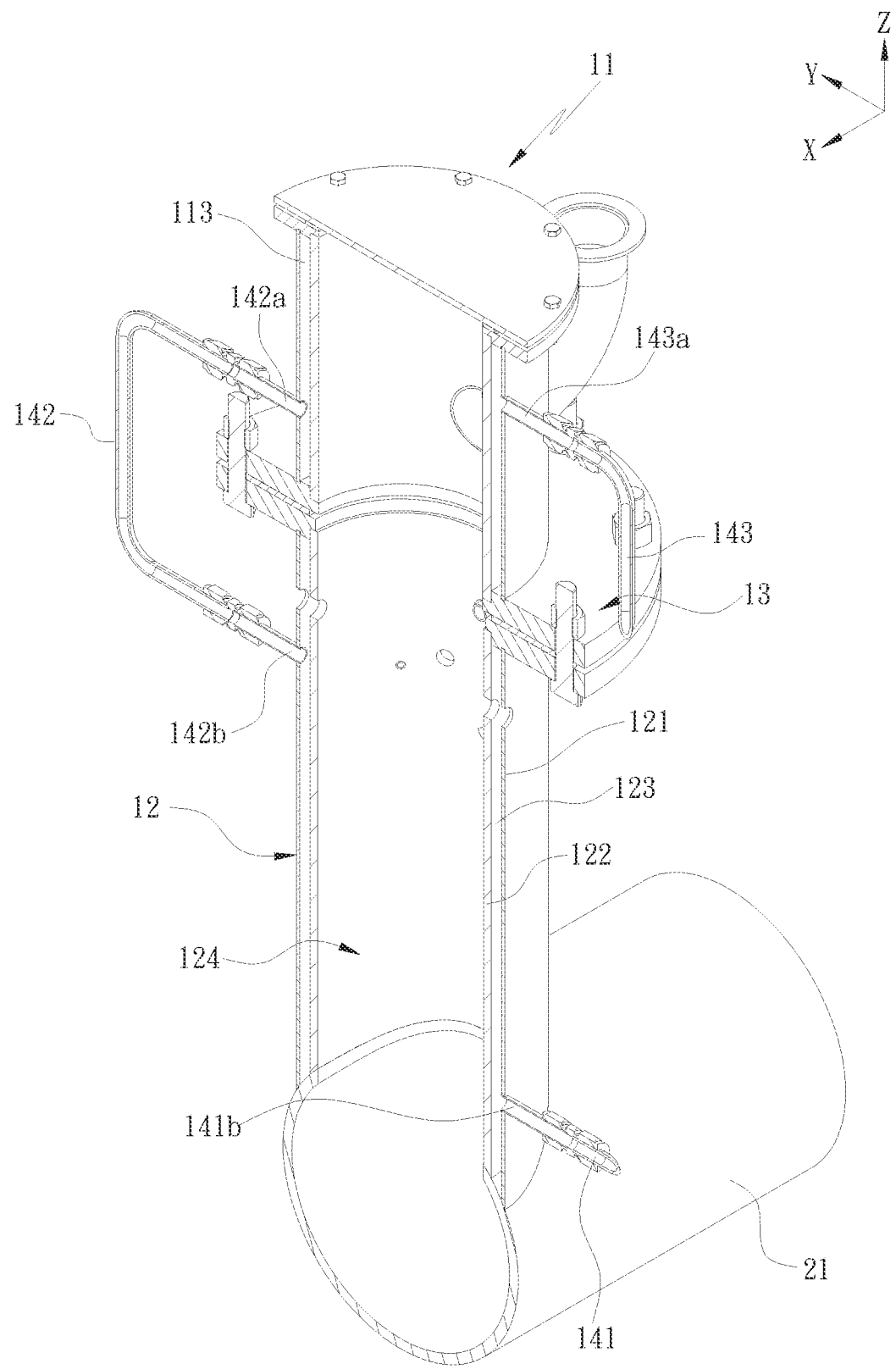
FIG. 5 is a perspective cross-section view of FIG. 4 along A-A.

Referring to FIG. 4, and FIG. 5, FIG. 4 is a side view of an embodiment of the invention; and FIG. 5 is a perspective cross-section view of FIG. 4 along A-A. The cooling unit 14 comprises a first pipe 141, a second pipe 142, a third pipe 143, and a plurality of pumps 144. The first pipe 141 comprises a first end 141a and a second end 141b, the first end 141a is connected to a cooling source (not shown on the figures), and the second end 141b is connected to a side of the second cooling chamber 123 of the reaction unit 12. The second pipe 142 comprises a first end 142a and a second end 142b, the second end 142b is connected to a side of the first cooling chamber 113 of the reaction unit 12, and the first end 142a is connected to an another side of the second cooling chamber 123 of the reaction unit 12. The third pipe 143 comprises a first end 143a and a second end 143b, the first end 143a is connected to another side of the first cooling chamber 113, and the second end 143b is connected to a cooling water outlet or a cooling loop (not shown on the figures). As shown in FIG. 5, a cooling water enters the second cooling chamber 123 from the first pipe 141, enters the first cooling chamber 113 through the second pipe 142, and leaves from the third pipe 143. In this embodiment, the first cooling chamber 113, the second cooling chamber 123 and the second pipe 142 are configured to form a three-dimensional annular water jacket enclosing the gas inlet chamber 114 and the reaction chamber 124 to provide sufficient cooling effect.

Figure 6:
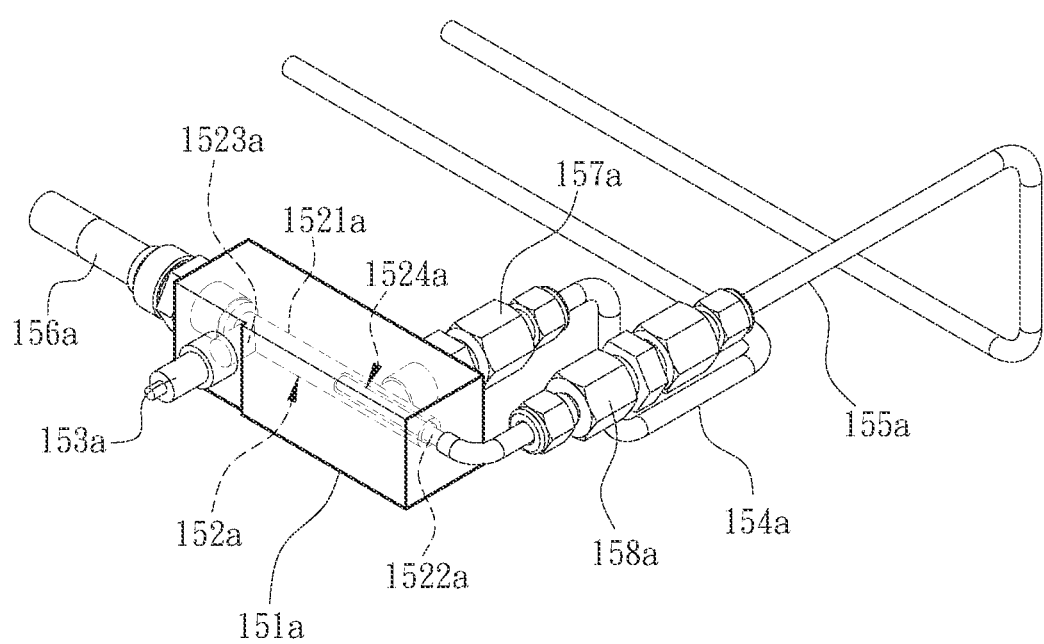
FIG. 6 is a perspective assembly view of a combustion unit of an embodiment of the invention.
Figure 7:
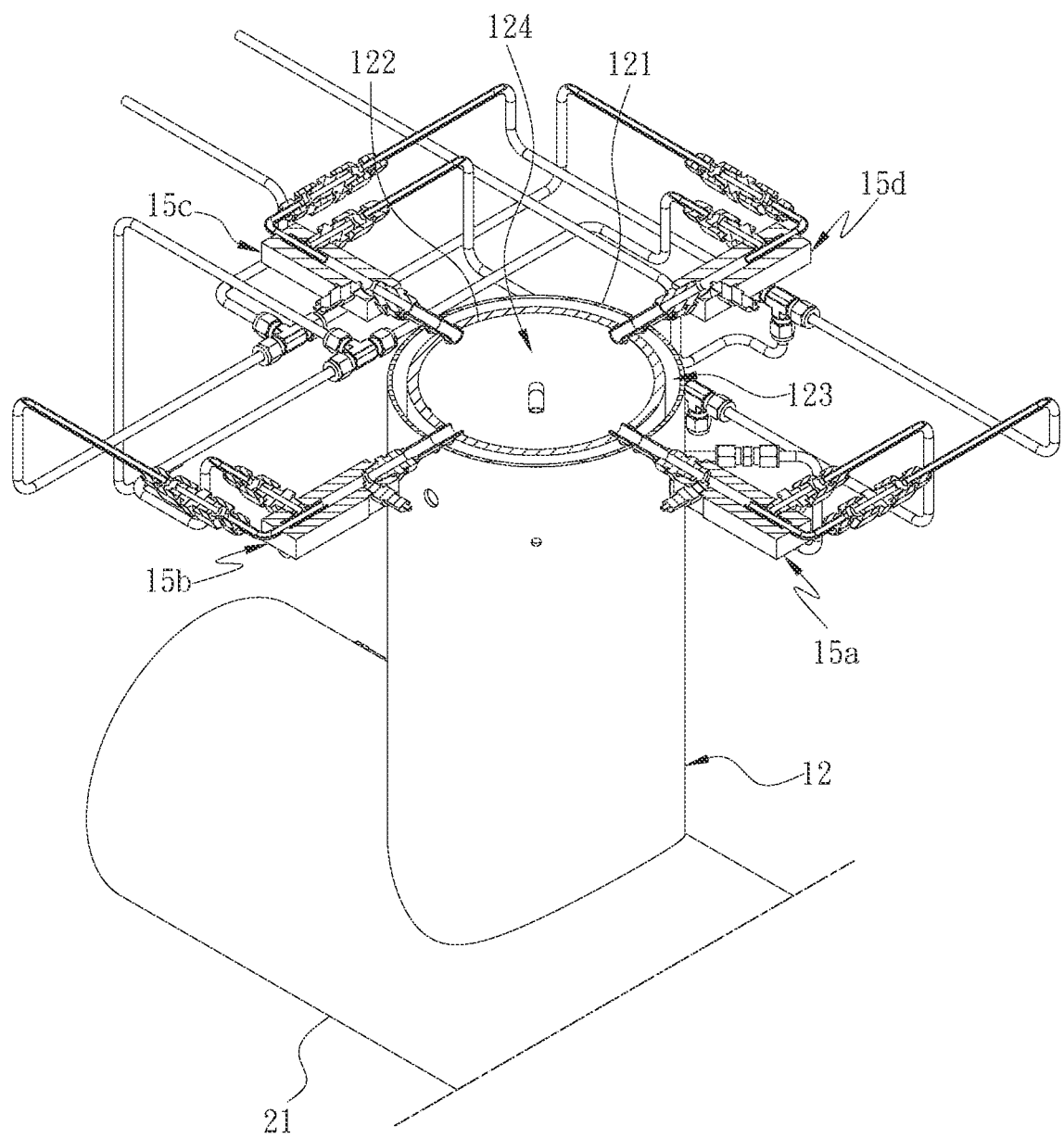
FIG. 7 is a perspective cross-section view of FIG. 4 along B-B.

The combustion unit provides an active flame, referring to FIG. 2A and FIG. 3, the combustion unit comprises a plurality of combustion assemblies 15a, 15b, 15c, 15d, referring to FIG. 7, in this embodiment, the plurality of combustion assemblies 15a, 15b, 15c, 15d are symmetrically mounted around the reaction chamber 124. Referring to FIG. 6, taking the combustion assembly 15a as an example, the combustion assembly 15a comprises a housing 151a, an inner tube 152a, an ignition plug 153a, a first duct 154a, a second duct 155a, and a plurality of connectors 156a, 157a, 158a. The inner tube 152a is disposed in the housing 151a. The inner tube 152a comprises a head end 1521a, a tail end 1522a, a first side end 1523a and a second side end 1524a. The head end 1521a is connected to the reaction chamber 124 via the connector 156a, the tail end 1522a is connected to the second duct 155a via the connector 158a, the second side end 1524a is connected to the first duct 154a via the connector 157a, and the first side end 1523a is connected to the ignition plug 153a. The first duct 154a is used to deliver an oxidant to the inner tube 152a. The oxidant may be oxygen, ozone, air, compressed air (CDA), oxygen-enriched air or a mixture thereof. The second duct 155a is used to deliver a fuel gas to the inner tube 152a. The fuel gas may be hydrogen, methane, natural gas, propane, liquefied petroleum gas (LPG) or a mixture thereof. The inner tube 152a may be regarded as a pre-mixing section. The oxidant and the fuel gas are mixed in the inner tube 152a. The ignition plug 153a is configured to generate a spark to the inner tube 152a, in this way, a pilot flame is provided near the connector 156a adjacent to the head end 1521a. In addition, as shown in FIG. 3, the apparatus further comprises a gas assembly 60, and the gas assembly 60 controls delivery of gas or fuel of the first duct 154a and the second duct 155a.

Referring to FIG. 2C, FIG. 3, and FIG. 6, in this embodiment, the connector 156a of the combustion assembly 15a penetrates the second outer wall 121 and the second inner wall 122 of the reaction unit 12. Please refer to FIG. 4 and FIG. 6, the connector 156a of the combustion assembly 15a and the upper opening 125 of the reaction unit 12 are spaced by a distance H1 between 50 mm and 55 mm, and the connector 156a of the combustion assembly 15a and the lower opening 126 of the reaction unit 12 are spaced by a distance H2 between 330 mm and 350 mm. The above dimensions are for reference only. According to different applications, these dimensions may have different values.

Figure 8:
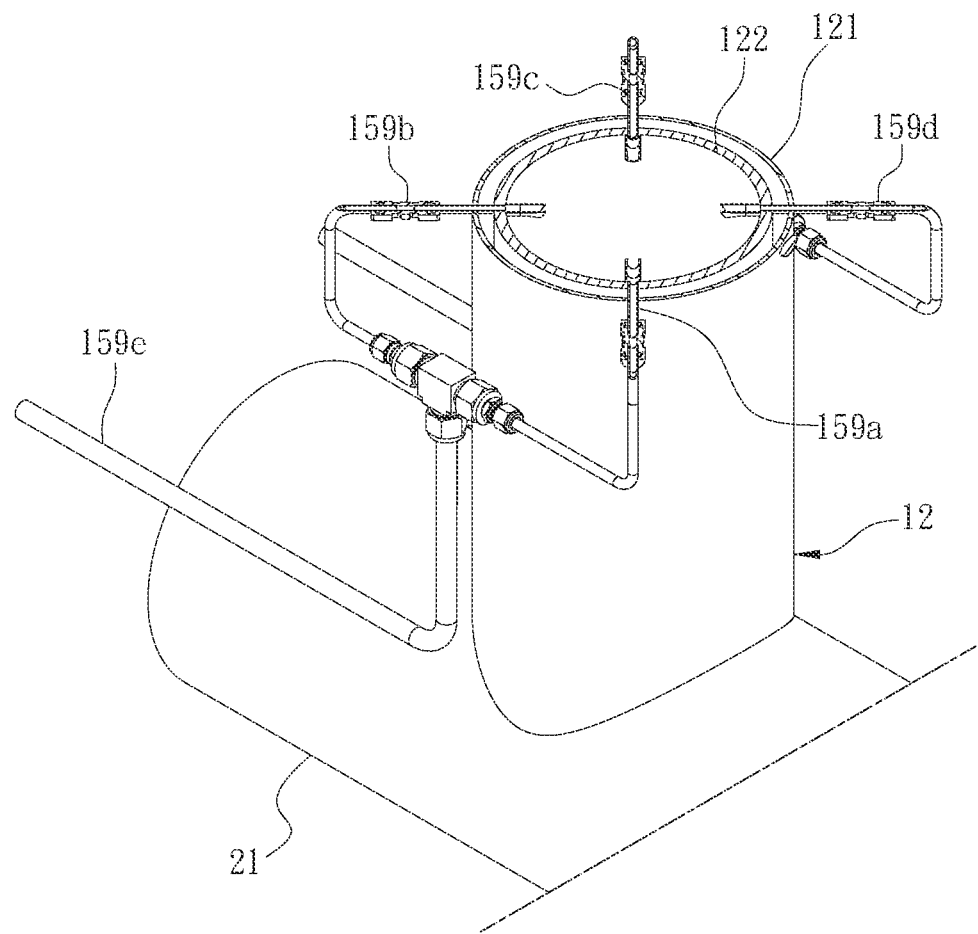
FIG. 8 is a perspective cross-section view of FIG. 4 along C-C.

In addition, in this embodiment, in order to avoid insufficient combustion of the pilot flame due to the less oxidant provided by the first duct 154a, referring to FIG. 8, the combustion unit further comprises at least one of third ducts 159a, 159b, 159c, 159d, 159e. The third ducts 159a, 159b, 159c, 159d communicate with the reaction chamber 124 and are located below the combustion assemblies 15a, 15b, 15c, 15d. The third ducts 159a, 159b, 159c, 159d provide more of the oxidant to the reaction chamber 124 to ensure the combustion of a combustion flame. In other embodiments, the ignition plug 153a may be mounted outside the housing 151a, such as disposing in the reaction chamber 124.

The combustion unit generates a flame wall in the reaction chamber 124, which leads to a temperature inside the reaction chamber 124 higher than 900° C. A temperature outside is lower than the temperature inside by disposition of the annular water jacket. In one embodiment, when a temperature of cooling water is between 16° C. and 20° C. (for example, 18° C.), even if the temperature inside the reaction chamber 124 is higher than 900° C., the temperature outside the second outer wall 121 of the reaction unit 12 is lower than 50° C., thereby safety of operators and operating environment is greatly improved. In contrast, for combustion-type waste gas treatment apparatus without the cooling unit 14, when the temperature inside the reaction chamber 124 is higher than 900° C., the temperature outside the second outer wall 121 is also high.

Referring to FIG. 2A, and FIG. 2B again, the exhaust portion 20 is a passage with an L shape. The exhaust portion 20 comprises a transverse section 21, a connecting section 22 and a vertical section 23. The transverse section 21 is substantially parallel to the installation plane of the apparatus, the vertical section 23 is substantially perpendicular to the installation plane, the transverse section 21 comprises a top gas inlet 211 and a lateral gas inlet 212, the top gas inlet 211 is connected to the lower opening 126 of the reaction unit 12 and communicates with the reaction chamber 124, the lateral gas inlet 212 receives a transverse gas flow 51 (for example, air), and one end of the transverse section 21 opposite to the lateral gas inlet 212 is connected to the connecting section 22. The connecting section 22 is a curved passage, the connecting section 22 comprises a transverse opening 221 and a longitudinal opening 222. The transverse opening 221 is connected to the transverse section 21, and the longitudinal opening 222 is upwardly connected to the vertical section 23. The vertical section 23 has a connecting opening 231 and an outlet 232, and the connecting opening 231 is connected to the longitudinal opening 222. In one embodiment, the vertical section 23 of the exhaust portion 20 is parallel to the reaction portion 10, so that the gas inlet chamber 114, the reaction chamber 124, and an internal passage 20a of the exhaust portion 20 is formed as a U-shaped passage, and the effluent stream 50 is allowed to travel along the direction of the U-shaped passage.

Referring to FIG. 4, in this embodiment, a height H3 (that is, an outer passage diameter of the exhaust portion 20) of the transverse section 21 is approximately between 215 mm and 230 mm. The exhaust portion 20 has a length L1 between 990 mm and 1010 mm, and a distance L2 from a center of the reaction portion 10 to a side end of the exhaust portion 20 is between 690 mm and 710 mm. The connecting section 22 has a height H4 between 380 mm and 400 mm, and the vertical section 23 has a height H5 between 790 mm and 810 mm. The above dimensions are for reference only. According to different applications, these dimensions may have different values.

During operation, the effluent stream 50 enters the gas inlet chamber 114 from the at least one guide conduit 116, and then downwardly flows to the reaction chamber 124 of the reaction unit 12. The combustion assemblies 15a, 15b, 15c, 15d of the combustion unit provide the flame wall in the reaction chamber 124. After the effluent stream 50 is burned by the flame wall with high temperature, the effluent stream 50 will be oxidized or decomposed to reduce or remove toxic substances in the effluent stream 50. The head end 1521a of the inner tube 152a of the combustion assembly 15a and the lower opening 126 of the reaction unit 12 are separated by a first height that facilitates to prolong a flowing time of the effluent stream 50 in the reaction chamber 124, and in one embodiment, the first height is between 330 mm and 350 mm.

The top gas inlet 211 of the transverse section 21 of the exhaust portion 20 receives the effluent stream 50 flowing downward through the reaction unit 12, and the downwardly flowing effluent stream 50 is driven by the transverse gas flow 51 to form a cyclone 52 that exhausts from the outlet 232 of the vertical section 23 via the connecting section 22. The vertical section 23 has a second height that is used to prolong a flowing time of the effluent stream 50 in the vertical section 23, so that a temperature of the effluent stream 50 is dropped below 200° C. as the effluent stream flows from the reaction chamber 124 to the outlet 232 of the vertical section 23. In one embodiment, the second height is between 790 mm and 810 mm.

Figure 9:
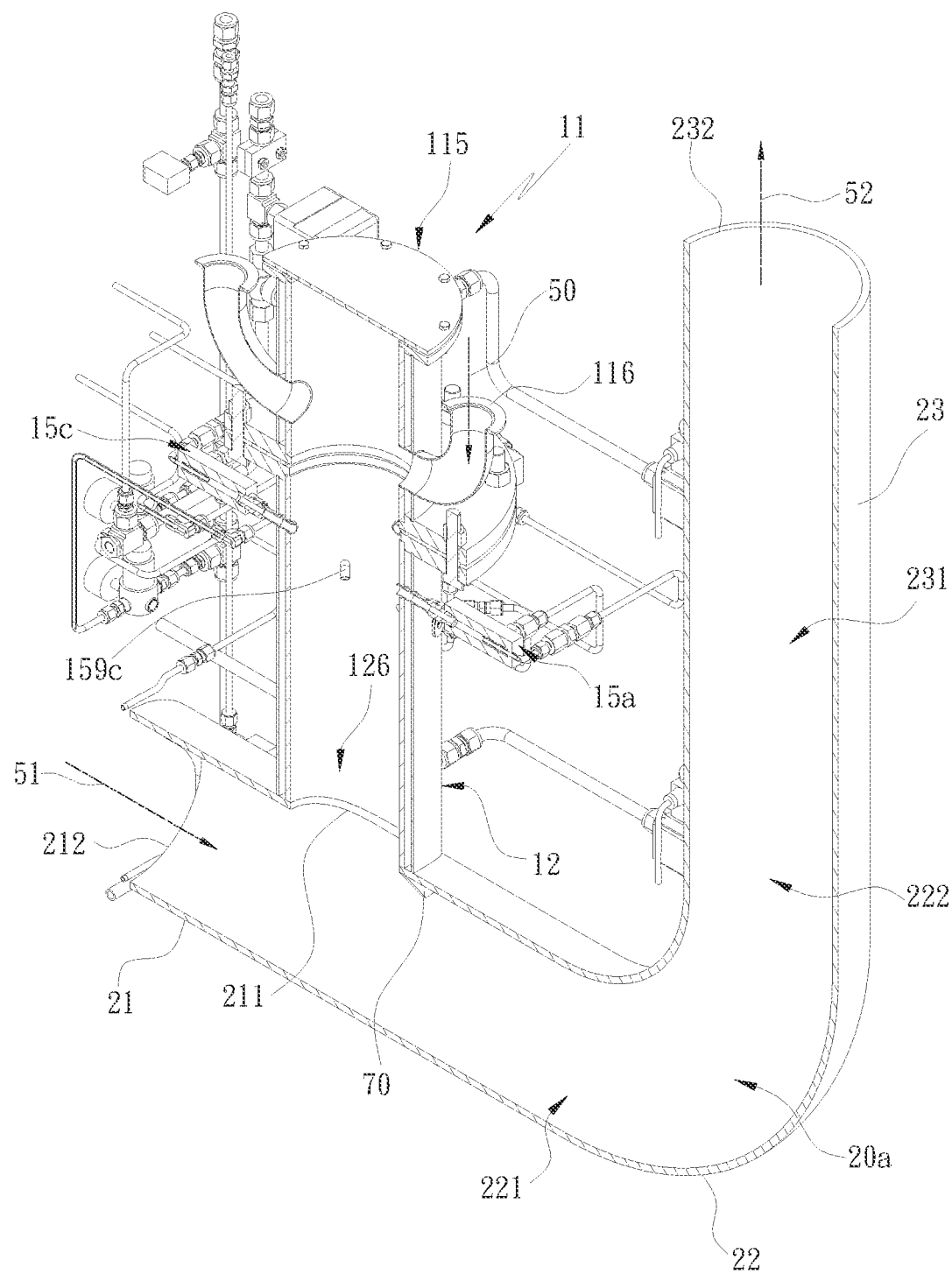
FIG. 9 is a perspective cross-section view of another embodiment of the invention.

Accordingly, the components of the apparatus are mounted in a vertical configuration, which is capable of greatly reducing an area occupied by the apparatus on the installation plane, and a flowing time of the effluent stream 50 in the reaction chamber 124 is prolonged since the heights of the reaction unit 12 and the vertical section 23 are extended simultaneously. Thus, the effluent stream 50 is fully oxidized or decomposed, and the flowing time of the effluent stream 50 in the vertical section 23 is also prolonged, so that the effluent stream 50 is sufficiently cooled down before leaving the apparatus to facilitate subsequent treatment or discharge. In other word, the invention not only reduces the installation area, but also enhances the processing efficiency and improves the safety by reducing the temperature of the effluent stream 50. Referring to FIG. 9, in one embodiment, a deflector 70 is further provided at an intersection of the effluent stream 50 and the transverse gas flow 51 to ensure that the effluent stream 50 can be fully mixed with the transverse gas flow 51.

Figure 10:
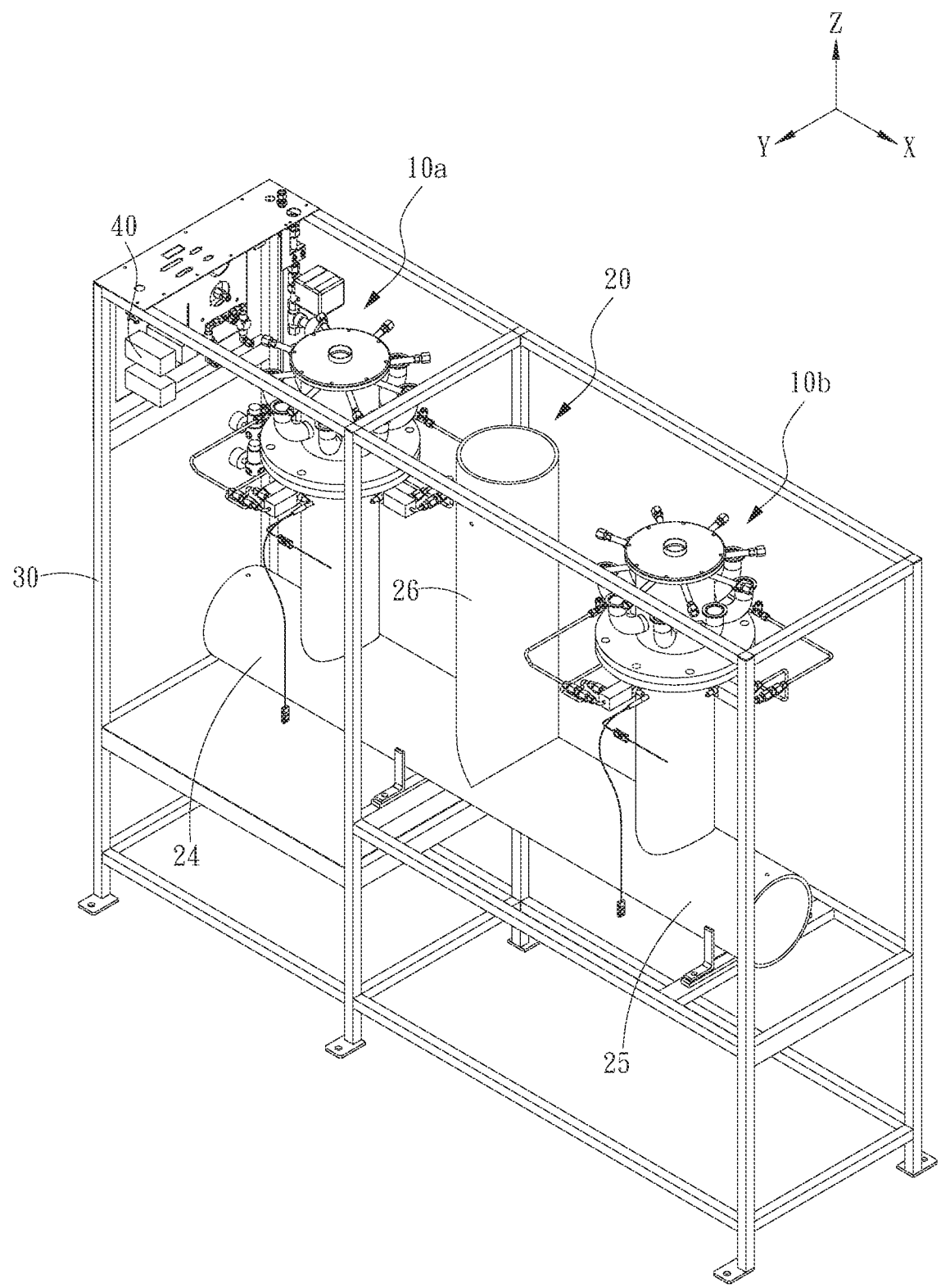
FIG. 10 is a perspective assembly view of another embodiment of the invention.
Figure 11:
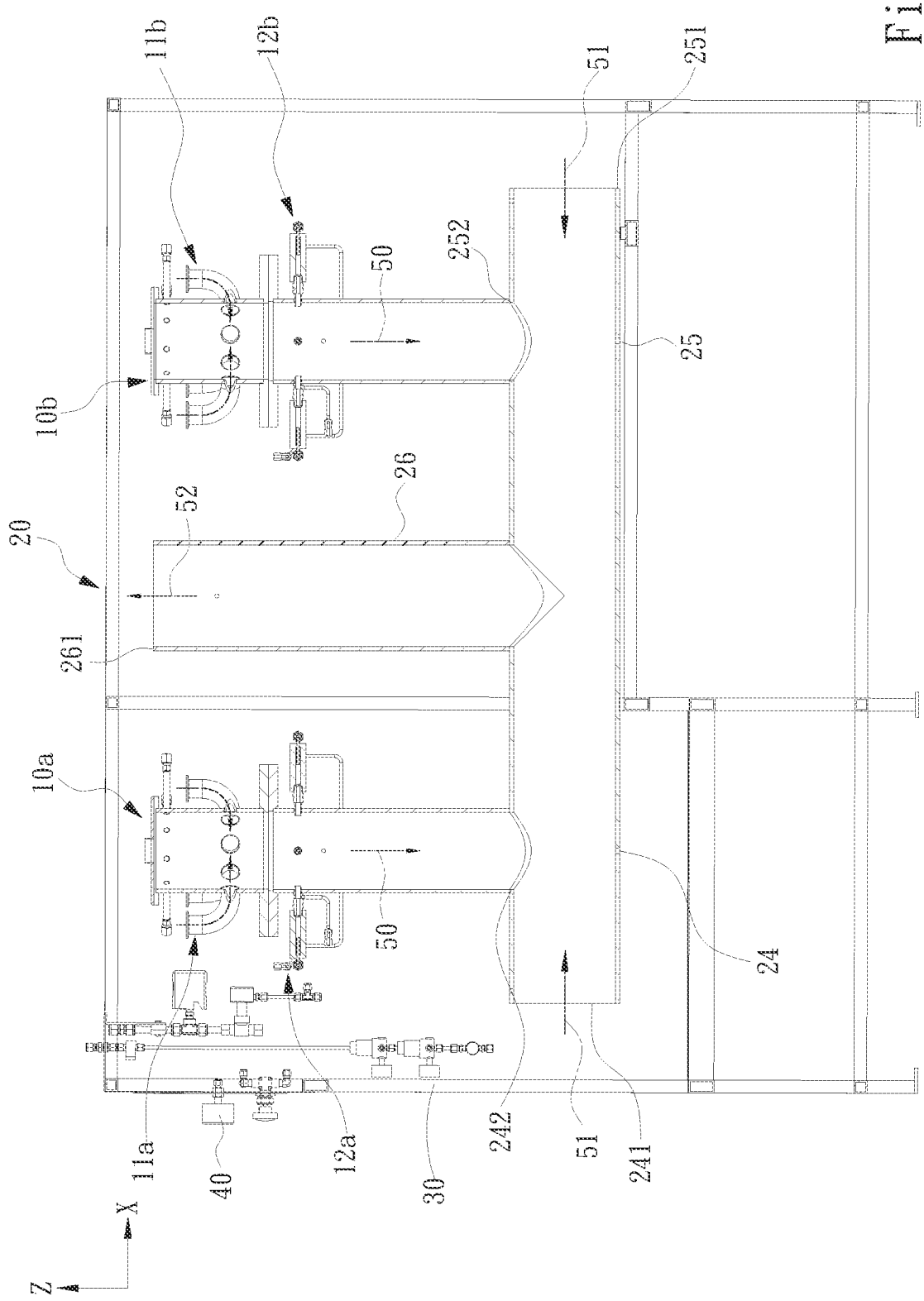
FIG. 11 is a cross-section view of FIG. 10 along the XZ plane.

Referring to FIG. 10 and FIG. 11, FIG. 10 is a perspective assembly view of another embodiment of the invention, and FIG. 11 is a cross-section view of FIG. 10 along the XZ plane. The apparatus comprises a first reaction portion 10a, a second reaction portion 10b, the exhaust portion 20, the frame 30 and the control portion 40. Please refer to the description of the reaction portion 10 above for components of the first reaction portion 10a and the second reaction portion 10b, and therefore some details will be omitted hereinafter. The first reaction portion 10a comprises a first gas inlet unit 11a and a first reaction unit 12a, and the second reaction portion 10b comprises a second gas inlet unit 11b and a second reaction unit 12b.

The exhaust portion 20 is a passage with an inverted T shape. The exhaust portion 20 comprises a first exhaust section 24, a second exhaust section 25, and a third exhaust section 26. The first exhaust section 24 is connected to a bottom of the first reaction unit 12a, the second exhaust section 25 is connected to a bottom of the second reaction unit 12b, the third exhaust section 26 is connected to the first exhaust section 24 and the second exhaust section 25. The third exhaust section 26, the first exhaust section 24 and the second exhaust section 25 are communicated with each other. The first exhaust section 24 and the second exhaust section 25 extend along a direction of the installation plane, and the third exhaust section 26 extends along a direction substantially overlapping the Z axis. With the above design of the exhaust portion 20, an installation area occupied by the apparatus can be greatly reduced.

The first exhaust section 24 comprises a lateral gas inlet 241 and a top gas inlet 242. The second exhaust section 25 comprises a lateral gas inlet 251 and a top gas inlet 252. The top gas inlets 242, 252 are connected to the first reaction unit 12a and the second reaction unit 12b, respectively, and the lateral gas inlets 241, 251 receive the transverse gas flow 51 (for example, air). One end of the first exhaust section 24 and one end of the second exhaust section 25 are opposite to the lateral gas inlets 241, 251, respectively, and are connected to the third exhaust section 26. The third exhaust section 26 has an outlet 261.

The first gas inlet unit 11a and the second gas inlet unit 11b receive the effluent stream 50. The effluent stream 50 downwardly enters the first reaction unit 12a and the second reaction unit 12b, and enters the first exhaust section 24 and the second exhaust section 25 after burned with high temperature, and then the downwardly flowing effluent stream 50 is driven by the transverse gas flow 51 to form the cyclone 52 exhausted from the outlet 261 of the third exhaust section 26.

What is claimed is:

1. An apparatus for treatment of gaseous pollutants comprising:
   a reaction portion, comprising:
   a gas inlet unit, comprising a first outer wall, a first inner wall, a first cooling chamber, a gas inlet chamber, and at least one guide conduit, the first cooling chamber mounted between the first outer wall and the first inner wall, the first inner wall defining the gas inlet chamber, the at least one guide conduit mounted on a side of the gas inlet chamber and introducing an effluent stream from a semiconductor manufacturing process to the gas inlet chamber;
   a reaction unit, coupled below the gas inlet unit, comprising a second outer wall, a second inner wall, a second cooling chamber and a reaction chamber, the second cooling chamber being defined between the second outer wall and the second inner wall, the second inner wall defining the reaction chamber, the reaction chamber and the gas inlet chamber communicating with each other to receive the effluent stream from the gas inlet chamber;
   a combustion unit, comprising at least one combustion assembly which comprises a pre-mixing section, an ignition plug, a first duct and a second duct, the first duct and the second duct are configured to introduce an oxidant and a fuel gas to the pre-mixing section, respectively, the ignition plug mounted adjacent to an opening end of the pre-mixing section, the opening end connected to the reaction chamber, the ignition plug is configured to generate a spark for igniting the oxidant and the fuel gas to provide a pilot flame to the reaction chamber through the opening end to burn the effluent stream; and a cooling unit, comprising a first pipe and a second pipe, the first pipe connected between a cooling source and the second cooling chamber, the second pipe connected between the second cooling chamber and the first cooling chamber, wherein the first cooling chamber and the second cooling chamber communicate with each other via the second pipe; and a passage connected to the reaction portion, comprising a transverse section, a connecting section and a vertical section, the transverse section substantially parallel to an extension of an installation plane of the apparatus for treatment of gaseous pollutants, the vertical section substantially perpendicular to the installation plane, the transverse section comprising a lateral gas inlet and a top gas inlet communicating with the reaction chamber of the reaction portion, the connecting section connected between the transverse section and the vertical section;

wherein the top gas inlet receives the effluent stream flowing downward through the reaction portion, the lateral gas inlet receives a transverse gas flow, and the effluent stream is driven by the transverse gas flow to form a cyclone that is discharged through the connecting section and from an outlet of the vertical section opposite to the connecting section.

2. The apparatus as claimed in claim 1, wherein the first cooling chamber is a first annular chamber, and is spaced with the gas inlet chamber.

3. The apparatus as claimed in claim 1, wherein the second cooling chamber is a second annular chamber, and is spaced with the reaction chamber.

4. The apparatus as claimed in claim 1, wherein the at least one combustion assembly comprises a first combustion assembly, a second combustion assembly, a third combustion assembly, and a fourth combustion assembly that are symmetrically mounted around the reaction chamber, and the combustion assemblies provide a combustion flame to the reaction chamber to form a flame wall, respectively.

5. The apparatus as claimed in claim 1, wherein the gas inlet unit, the reaction unit, and the vertical section of the passage are mounted along a longitudinal extension perpendicular to the installation plane.

6. The apparatus as claimed in claim 1, wherein when the pilot flame burns the effluent stream in the reaction chamber, a temperature inside the reaction chamber is higher than 900° C., and a temperature outside the second outer wall is lower than 50° C.

7. The apparatus as claimed in claim 1, wherein the pre-mixing section of the combustion assembly is connected to the reaction portion via the opening end, and the opening end and a lower opening of the reaction portion are separated by a first height that prolongs a flowing time of the effluent stream in the reaction chamber.

8. The apparatus as claimed in claim 1, wherein the vertical section has a second height prolonging a flowing time of the effluent stream in the vertical section, so that a temperature of the effluent stream is dropped below 200° C. as the effluent stream flows from the reaction chamber to the outlet of the vertical section.

9. The apparatus as claimed in claim 1, wherein the gas inlet chamber, the reaction chamber, and an internal passage of the passage is formed as a U-shaped passage.

10. An apparatus for treatment of gaseous pollutants comprising:

a reaction portion comprising:

a gas inlet unit, comprising a gas inlet chamber, and at least one guide conduit, the at least one guide conduit mounted on a side of the gas inlet chamber and introducing an effluent stream from a semiconductor manufacturing process to the gas inlet chamber;

a reaction unit coupled below the gas inlet unit, comprising a reaction chamber, the reaction chamber and the gas inlet chamber communicating with each other to receive the effluent stream from the gas inlet chamber, wherein the reaction unit has a first height for prolonging a flowing time of the effluent stream in the reaction chamber; and a combustion unit, comprising at least one combustion assembly which comprises a pre-mixing section, an ignition plug, a first duct and a second duct, the first duct and the second duct are configured to introduce an oxidant and a fuel gas to the pre-mixing section, respectively, the ignition plug mounted adjacent to an opening end of the pre-mixing section, the opening end connected to the reaction chamber, the ignition plug is configured to generate a spark for igniting the oxidant and the fuel gas and to provide a pilot flame to the reaction chamber through the opening end to burn the effluent stream; and a passage connected to the reaction portion, comprising a transverse section, a connecting section and a vertical section, the transverse section substantially parallel to an installation plane of the apparatus for treatment of gaseous pollutants, the vertical section substantially perpendicular to the installation plane, the transverse section comprising a lateral gas inlet and a top gas inlet communicating with the reaction chamber of the reaction portion, the connecting section connected between the transverse section and the vertical section;

wherein the top gas inlet receives the effluent stream flowing downward through the combustion unit, the lateral gas inlet receives a transverse gas flow, and the effluent stream is driven by the transverse gas flow to form a cyclone that is discharged through the connecting section and from an outlet of the vertical section opposite to the connecting section; and wherein the vertical section has a second height for prolonging a flowing time of the effluent stream in the vertical section, so that a temperature of the effluent stream is dropped below 200° C. as the effluent stream flows from the reaction chamber to the outlet of the vertical section.

11. The apparatus as claimed in claim 10, wherein the gas inlet unit further comprises a first annular chamber spaced with the gas inlet chamber, the reaction unit further comprises a second annular chamber spaced with the reaction chamber, the first annular chamber and the second annular chamber communicate with each other and are filled with a cooling medium, so that when the pilot flame burns the effluent stream in the reaction chamber, a temperature inside the reaction chamber is higher than 900° C., and a temperature outside the reaction chamber is lower than 50° C.

12. The apparatus as claimed in claim 10, wherein the at least one combustion assembly comprises a first combustion assembly, a second combustion assembly, a third combustion assembly, and a fourth combustion assembly that are symmetrically mounted around the reaction chamber, and the combustion assemblies provide a combustion flame to the reaction chamber to form a flame wall, respectively.

13. The apparatus as claimed in claim 10, wherein the gas inlet unit, the reaction unit, and the vertical section of the passage are mounted along a longitudinal extension perpendicular to the installation plane.

14. The apparatus as claimed in claim 10, wherein the gas inlet chamber, the reaction chamber, and an internal passage of the passage is formed as a U-shaped passage.

* * * * *